United States Patent
Guillorn et al.

(10) Patent No.: US 10,249,739 B2
(45) Date of Patent: Apr. 2, 2019

(54) NANOSHEET MOSFET WITH PARTIAL RELEASE AND SOURCE/DRAIN EPITAXY

(71) Applicant: INTERNATIONAL BUSINESS MACHINES CORPORATION, Armonk, NY (US)

(72) Inventors: Michael A. Guillorn, Cold Springs, NY (US); Terence B. Hook, Jericho, VT (US); Nicolas J. Loubet, Guilderland, NY (US); Robert R. Robison, Colchester, VT (US); Reinaldo A. Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/446,636

(22) Filed: Mar. 1, 2017

(65) Prior Publication Data
US 2018/0254329 A1    Sep. 6, 2018

(51) Int. Cl.
| | | |
|---|---|---|
| *H01L 21/02* | (2006.01) | |
| *H01L 29/786* | (2006.01) | |
| *H01L 29/06* | (2006.01) | |
| *H01L 29/66* | (2006.01) | |
| *H01L 29/78* | (2006.01) | |
| *H01L 29/423* | (2006.01) | |
| *H01L 29/165* | (2006.01) | |

(52) U.S. Cl.
CPC ...... *H01L 29/6681* (2013.01); *H01L 29/0665* (2013.01); *H01L 29/165* (2013.01); *H01L 29/42392* (2013.01); *H01L 29/6653* (2013.01); *H01L 29/66545* (2013.01); *H01L 29/66553* (2013.01); *H01L 29/785* (2013.01); *H01L 29/7849* (2013.01)

(58) Field of Classification Search
CPC ........... H01L 29/78696; H01L 29/0673; H01L 29/785; H01L 29/66545; H01L 29/0665
See application file for complete search history.

(56) References Cited

U.S. PATENT DOCUMENTS

| | | |
|---|---|---|
| 4,661,374 A | 4/1987 | Doering |
| 6,596,554 B2 | 7/2003 | Unnikrishnan |
| 7,932,123 B2 | 4/2011 | Rogers et al. |
| 8,039,847 B2 | 10/2011 | Nuzzo et al. |

(Continued)

OTHER PUBLICATIONS

Blosse et al., "A Novel Low Cost 65nm CMOS Process Architecture With Self Aligned Isolation and W Cladded Source/Drain", IEDM Technical Digest. IEEE International Electron Devices Meeting. Dec. 13-15, 2004. pp. 1-4.

*Primary Examiner* — Bradley Smith
*Assistant Examiner* — David J Goodwin
(74) *Attorney, Agent, or Firm* — Tutunjian & Bitetto, P.C.; Vazken Alexanian

(57) ABSTRACT

A method is presented for forming a nanosheet metal oxide semiconductor field effect transistor (MOSFET) structure. The method includes forming a heteroepitaxial film stack including at least one sacrificial layer and at least one channel layer, patterning the heteroepitaxial film stack, forming a dummy gate stack with sidewall spacers, and forming a cladded or embedded epitaxial source/drain material along the patterned heteroepitaxial film stack sidewalls. The method further includes removing the dummy gate stack, partially removing the at least one sacrificial layer, and forming a replacement gate stack.

18 Claims, 8 Drawing Sheets

(56) References Cited

U.S. PATENT DOCUMENTS

| | | | |
|---|---|---|---|
| 8,895,406 B2 | 11/2014 | Rogers et al. | |
| 9,435,291 B2 | 8/2016 | Balakrishnan et al. | |
| 2011/0003451 A1* | 1/2011 | Orlowski | H01L 29/42392 438/285 |
| 2014/0225065 A1* | 8/2014 | Rachmady | H01L 29/42392 257/24 |
| 2015/0123215 A1 | 5/2015 | Obradovic et al. | |
| 2016/0071729 A1 | 3/2016 | Hatcher et al. | |
| 2016/0111284 A1 | 4/2016 | Kittl et al. | |
| 2016/0111337 A1 | 4/2016 | Hatcher et al. | |
| 2016/0118483 A1* | 4/2016 | Flachowsky | H01L 29/66818 257/192 |
| 2016/0126310 A1 | 5/2016 | Rodder et al. | |
| 2016/0315167 A1* | 10/2016 | Nakamura | H01L 29/517 |
| 2017/0207313 A1* | 7/2017 | Song | H01L 29/42392 |
| 2017/0250291 A1* | 8/2017 | Lee | H01L 29/66545 |

\* cited by examiner

US 10,249,739 B2

NANOSHEET MOSFET WITH PARTIAL RELEASE AND SOURCE/DRAIN EPITAXY

BACKGROUND

Technical Field

The present invention relates generally to semiconductor devices, and more specifically, to nanosheet metal oxide semiconductor field effect transistors (MOSFETs) with partial release and cladded source/drain epitaxy.

Description of the Related Art

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions. As semiconductor devices scale to smaller dimensions, nanosheet devices provide advantages. Stacked nanowires provide area efficiency. Stacked nanowires provide, for example, increased drive current within a given layout area.

SUMMARY

In accordance with an embodiment, a method is provided for forming a nanosheet metal oxide semiconductor field effect transistor (MOSFET) structure. The method includes forming a heteroepitaxial film stack including at least one sacrificial layer and at least one channel layer, patterning the heteroepitaxial film stack, and forming a dummy gate stack and sidewall spacers. The method further includes forming an epitaxial source/drain material along the patterned heteroepitaxial film stack sidewalls, removing the dummy gate stack, partially removing the at least one sacrificial layer, and forming a replacement gate stack.

In accordance with another embodiment, a method is provided for forming a nanosheet metal oxide semiconductor field effect transistor (MOSFET) structure. The method includes forming a heteroepitaxial film stack including alternating sacrificial and channel layers, forming a dummy gate stack, and forming an epitaxial source/drain material along sidewalls of the heteroepitaxial film stack. The method further includes removing the dummy gate stack, partially removing the sacrificial layers, and forming a replacement gate stack. The structure can be subjected to an additional thermal budget allowing the silicon-germanium (SiGe) and silicon sacrificial layers to completely relax.

In accordance with another embodiment, a nanosheet metal oxide semiconductor field effect transistor (MOSFET) structure is provided. The structure includes a heteroepitaxial film stack including at least one sacrificial layer and at least one channel layer, a dummy gate stack with sidewall spacers, and an epitaxial source/drain material formed along the heteroepitaxial film stack sidewalls. The dummy gate stack is removed and the at least one sacrificial layer is partially removed to form a replacement gate stack.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The following description will provide details of preferred embodiments with reference to the following figures wherein.

Throughout the drawings, same or similar reference numerals represent the same or similar elements.

DETAILED DESCRIPTION

Figure 1:
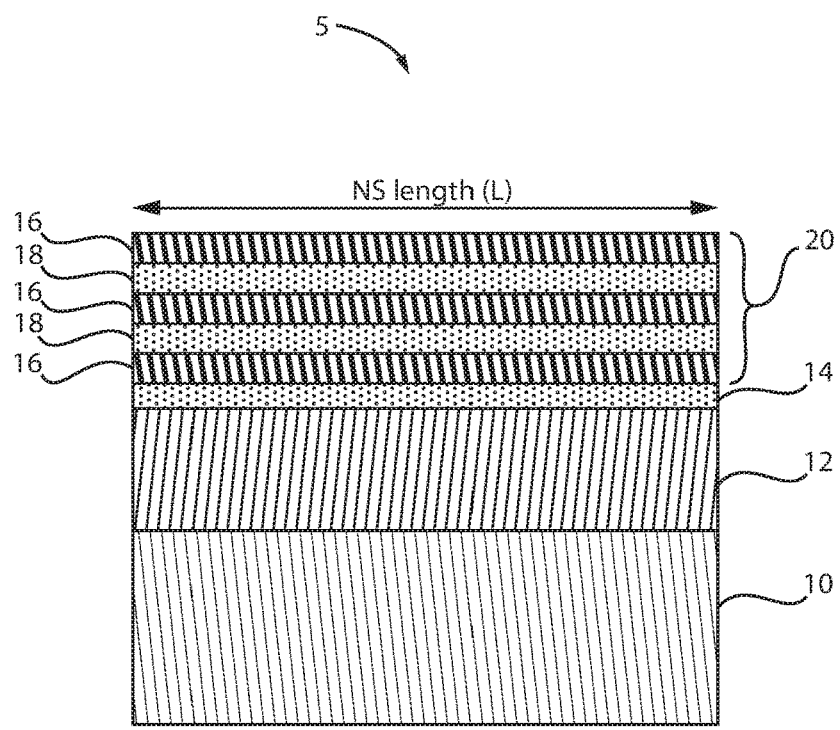
FIG. 1 is a cross-sectional view of a semiconductor structure cut along the nanosheet (NS) length direction (perpendicular to gate), where a heteroepitaxial stack is formed over a substrate, in accordance with an embodiment of the present invention.

Embodiments of the present invention provide devices and fabrication methods for nanosheet metal oxide semiconductor field effect transistors (MOSFETs). Semiconductor devices such as, for example, semiconductor fin field effect transistors (FinFETs) are replacing other structures as a next step in the evolution of complementary metal oxide semiconductor (CMOS) devices. One type of semiconductor device that has been touted as a viable option beyond the 7 nm technology node includes nanosheet containing devices. By "nanosheet containing devices," it is meant that the device channel includes one or more layers of nanosheets. Each nanosheet has a vertical thickness that is substantially less than the width of each nanosheet. In one example embodiment, a nanosheet stack can be formed by alternating semiconductor material layers.

Examples of semiconductor materials that can be used include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one non-limiting embodiment, a first semiconductor material that provides one alternating layer of the stacked nanosheet is silicon (Si) and a second semiconductor material that provides the other alternating layer of the stacked nanosheet is silicon germanium (SiGe).

According to the exemplary embodiments, both the active material and the sacrificial material can be substantially crystalline. In one embodiment, the layers of the active material can be comprised of a III-V or II-VI material. In one embodiment, sufficient chemical dissimilarity can be achieved by the active material comprising Group IV atoms, and the sacrificial material comprising of Group II-VI or III-V atoms. In another embodiment, sufficient chemical dissimilarity can be achieved by the active material comprising fully covalent Group IV materials, and the sacrificial material having mic or polar character in their bonds.

The exemplary embodiments can be implemented to minimize the effect of plastic relaxation of SiGe to achieve compressive channel stress by avoiding a source/drain recess etch (e.g., avoiding embedded source/drain epitaxy and instead growing cladded source/drain epitaxy) and by using, e.g., silicon germanium (SiGe) nanosheet channel regions and silicon (Si) sacrificial release layers in the heteroepitaxial stack.

By avoiding a source/drain recess etch, there exists no open surface in the fin length direction to allow the Si/SiGe heteroepitaxial stack to relax elastically. This means the strain that results from the heteroepitaxial stack growth is preserved through the entire process steps. In this case, it is not necessary to partially release the sacrificial silicon (Si) layers during the replacement metal gate (RMG) processing to preserve compressive strain in the silicon germanium (SiGe) channel layers. This is because the sacrificial silicon (Si) layers also exist in the source/drain regions (having not been etched away to form an embedded source/drain epitaxy), and these remaining Si layers preserve the compressive strain along the SiGe nanosheet length. In this case, a full nanosheet release can be performed. However, partial nanosheet release remains optional in order to maximize the electrical channel width within a device structure.

The exemplary embodiments leverage the effect of elastic relaxation of SiGe, in addition to partial nanosheet release, to induce strain in nanosheet channel regions. Nanosheet structures are formed by first growing a heteroepitaxial stack of a channel layer (e.g., Si) and a sacrificial layer (e.g., SiGe), each layered on top of each other any number of times. With the dummy gate stack and sidewall spacers formed, a source/drain recess etch is performed, which removes the heteroepitaxial stack material in the source/drain portions of the device in order to create a template for embedded source/drain epitaxial growth. Open surfaces can be created in the fin length direction and allow the Si/SiGe heteroepitaxial stack to relax elastically. As a result of the SiGe relaxing elastically, the adjacent Si layers end up having tensile strain. Subsequently, during the replacement metal gate (RMG) process, the sacrificial SiGe layers can be partially, but not fully, etched away, resulting in a corrugated channel profile along the heteroepitaxial stack sidewall. The remaining portion of the sacrificial SiGe layers relaxed elastically transfer a tensile strain in the silicon nanosheets channels, which can be leveraged to enhance current transport in n-type nanosheet MOSFETs.

In addition to the transport benefit to the strained Si nanosheet channels, the presence of remaining sacrificial Si layers (if the extent of partial release is optimized) between the nanosheets can increase the total electrical channel width of the channel region, in turn resulting in more current per device structure. This means the benefit of partial release is two-fold: 1) increased channel strain and 2) increased electrical $W_{eff}$.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "over," "overlying," "atop," "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used include ion beam etching, plasma etching or laser ablation.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

The terms "gas" and "gases" are used interchangeably, unless otherwise noted, and refer to one or more precursors, reactants, catalysts, carrier, purge, cleaning, combinations thereof, as well as any other fluid introduced into the chamber body.

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a plane of a monocrystalline silicon layer on which the field effect transistor devices are fabricated. The term "vertical transistor" refers to a transistor with individual semiconductor components vertically oriented with respect to the major surface so that the current flows vertically from source to drain. By way of example, for a vertical FET, the source, channel, and drain regions are formed in relatively vertical alignment with respect to the major surface.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a cross-sectional view of a semiconductor structure cut along the nanosheet (NS) length direction (perpendicular to gate), where a heteroepitaxial stack is formed over a substrate, in accordance with an embodiment of the present invention.

A semiconductor structure 5 includes a semiconductor substrate 10 with a buried insulator layer 12 (or buried oxide layer (BOX)) with a silicon-on-insulator (SOI) layer 14 formed thereon. The substrate can be any substrate known in the art, such as, for example, a semiconductor-on-insulator (SOI) substrate 14 or a bulk substrate. In an embodiment, an SOI substrate 14 is used.

A heteroepitaxial stack 20 can be formed over the SOI layer 14. The heteroepitaxial stack 20 includes a stack of alternating semiconductor layers. The first semiconductor layer can be, e.g., a sacrificial layer 16 and the second semiconductor layer can be, e.g., a nanosheet layer 18. The sacrificial layer 16 can be, e.g., silicon germanium (SiGe) and the channel layer can be, e.g., silicon (Si). Along the NS length direction, the heteroepitaxial stack 20 extends along the length of the substrate 10 and buried insulator layer 12.

According to various embodiments, patterning can use processes including photolithography and optical masks to print patterns that guide the deposition or removal of material from a wafer at specific steps in the fabrication process of a device. At each layer of the device, material can be deposited or removed in those areas not covered by the mask and then a new mask is used for the next layer. The wafer can be repeatedly processed in this fashion, creating multiple layers of circuitry.

According to various embodiments, stripping can refer to a process in which a wafer enters a so-called developer process during which the weakened photoresist can be removed, helping to transfer patterns onto an oxide, such as silicon dioxide. Various wet and dry etch processes exist that can treat the exposed silicon dioxide; wet processes use chemical substances and dry processes use gases. The removal of the remaining photoresist is called strip. Dry and wet strippers can be employed to make sure that the photoresist is completely removed. As photoresists are organic materials, which, if not properly removed, can cause defects on the wafer.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The buried insulator layer 12 can be a crystalline or non-crystalline oxide or nitride. In an embodiment, the buried insulator layer 12 is an oxide, such as, for example, silicon dioxide. The buried insulator layer 12 can be continuous or discontinuous. The buried insulator layer 12 can typically have a thickness from about 1 nm to about 500 nm. In an embodiment, the buried insulator layer 12 can have a thickness ranging from about 10 nm to about 100 nm. In an alternative embodiment, the buried insulator layer 12 can include multiple dielectric layers or a stack of dielectric layers including a silicon oxide layer and/or a silicon nitride layer.

The SOI substrate 14 can be formed using any technique known in the art, such as, for example, Separation by Ion Implantation of Oxygen (SIMOX) or a layer transfer process. When a layer transfer process is employed, an optional thinning step can follow the bonding of two semiconductor wafers together. The optional thinning step can reduce the thickness of a layer to a desirable thickness. In an alternative embodiment, if a bulk substrate is used, an insulating material (e.g., oxide) can be used to electrically isolate subsequently formed components (e.g., fins).

By way of example only, the SOI layer 14 has a thickness of from about 8 nanometers (nm) to about 20 nm, and ranges therebetween. If commercially available SOI wafers are employed, the thickness of the SOI layer can be reduced, if needed, using a thermal oxidation and oxide strip process on the SOI layer which can be repeated until a desired thickness is achieved.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.)

and a fill can be formed by a second process (e.g., CVD, electrodeposition, PVD, etc.).

Figure 2:
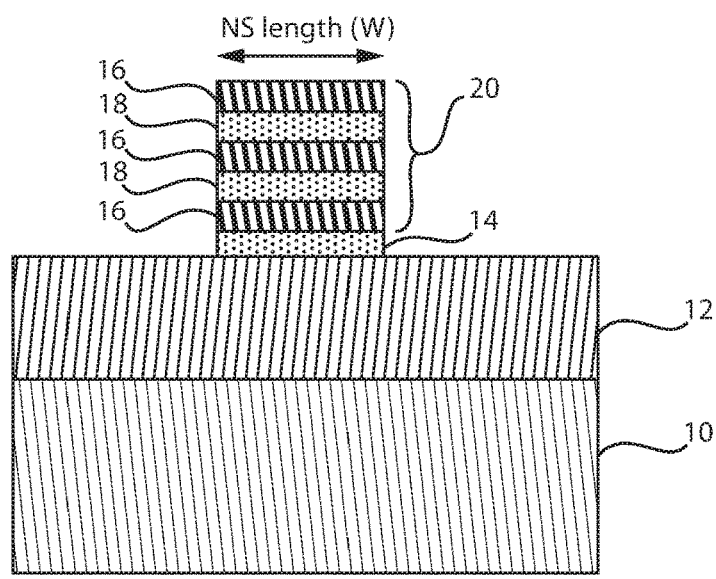
FIG. 2 is a cross-sectional view of a semiconductor structure cut along the nanosheet (NS) width direction (parallel to gate), in accordance with an embodiment of the present invention.

FIG. 2 is a cross-sectional view of a semiconductor structure cut along the nanosheet (NS) width direction (parallel to gate), in accordance with an embodiment of the present invention.

Along the NS width direction, the heteroepitaxial stack 20 extends along a portion of the substrate 10 and buried insulator layer 12.

Figure 3:
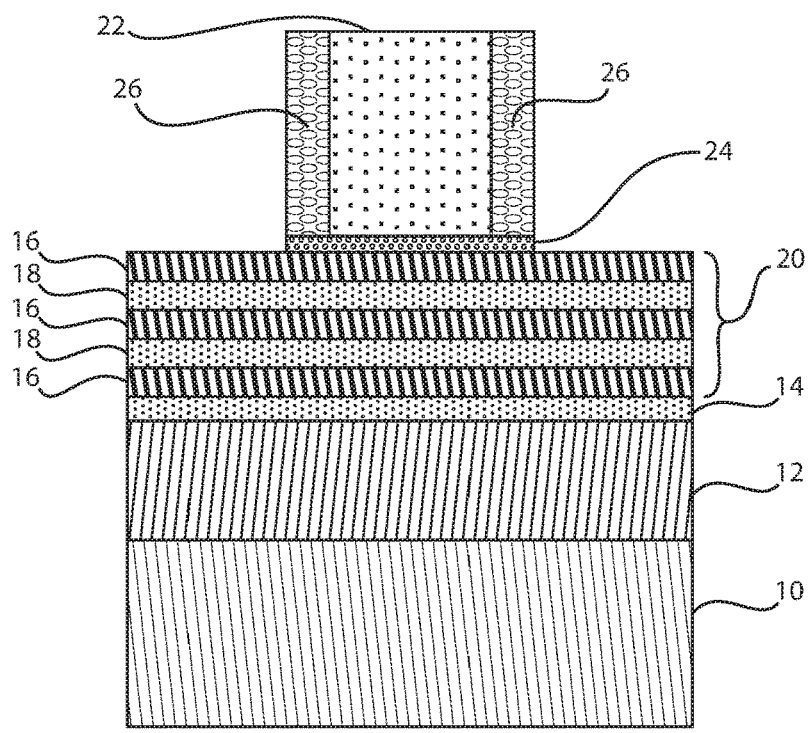
FIG. 3 is a cross-sectional view of the semiconductor device of FIG. 1 (NS length direction) illustrating the formation of a dummy gate and sidewall spacers, in accordance with an embodiment of the present invention.

FIG. 3 is a cross-sectional view of the semiconductor device of FIG. 1 (NS length direction) illustrating the formation of a dummy gate and sidewall spacers, in accordance with an embodiment of the present invention.

In various embodiments, a dummy gate 22 is formed over a dummy gate oxide 24. The dummy gate oxide 24 contacts a portion of the top surface of the heteroepitaxial stack 20. Sidewall spacers 26 can be formed adjacent the dummy gate 22.

The dummy gate 22 has a thickness greater than the thickness of the dummy gate oxide 24. The dummy gate 22 has a thickness greater than the thickness of the heteroepitaxial stack 20.

In various embodiments, the dummy gate 22 is formed by forming the dummy gate 22 followed by patterning. The dummy gate 22 can include a stack of materials, such as a dummy gate dielectric (e.g., silicon oxide), amorphous silicon, a dielectric cap (e.g., silicon nitride). Later in the process sequence, the dummy gate 22 is removed, and replaced with a metal fill. The top surface of the dummy gate 22 can be coplanar with the top surface of the spacers 26.

The spacers 26 can be formed by deposition followed by a directional etch (e.g., RIE). Spacers 26 can be formed along the sidewalls of the dummy gate 22. For example, spacer material such as a nitride (e.g., silicon nitride) can be deposited in a conventional manner, such as by chemical vapor deposition (CVD) or atomic layer deposition (ALD). Other techniques, which can be suitable for deposition of a nitride layer, include low-pressure CVD (LPCVD) and atmospheric pressure (CVD) (APCVD). Portions of the deposited nitride layer can be subsequently etched away in a conventional manner to form the spacers 26. Spacer material can be silicon oxide, silicon oxynitride, silicon nitride, SiBCN, SiOCN, SiOC, or any suitable combination of those materials.

Figure 4:
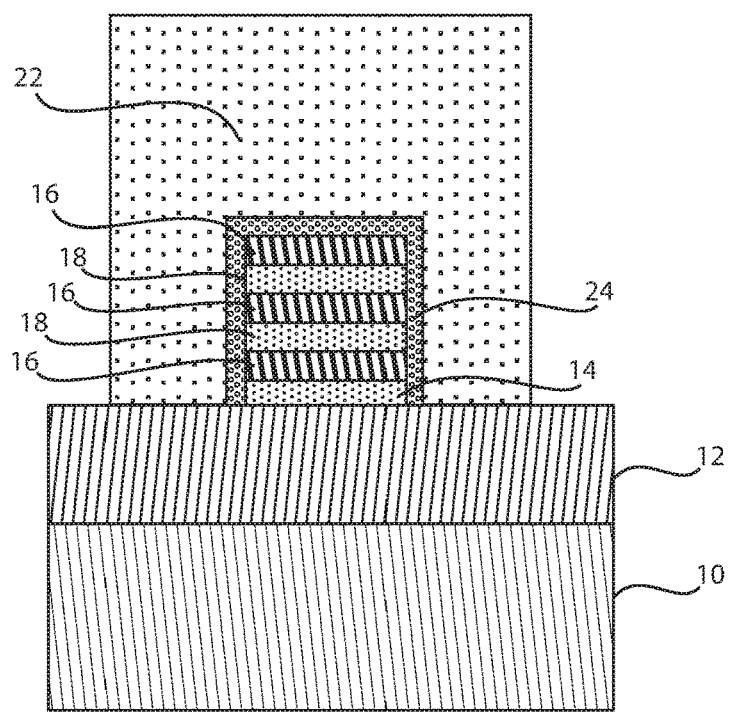
FIG. 4 is a cross-sectional view of the semiconductor device of FIG. 2 (NS width direction) illustrating the formation of a dummy gate and dummy gate oxide, in accordance with an embodiment of the present invention.

FIG. 4 is a cross-sectional view of the semiconductor device of FIG. 2 (NS width direction) illustrating the formation of a dummy gate and dummy gate oxide, in accordance with an embodiment of the present invention.

Along the NS width direction, the dummy gate 22 is shown covering the entire heteroepitaxial stack 20. Additionally, the dummy gate oxide 24 covers the entire heteroepitaxial stack 20.

The dummy gate oxide 24 is formed over the heteroepitaxial stack 20. In various embodiments, the dummy gate oxide 24 can be silicon oxide (e.g., $SiO_2$) or a silicon oxide/silicon borocarbonitride (SiBCN) bilayer, which can be formed by chemical vapor deposition (CVD), ALD, or a combination thereof. The dummy gate oxide 24 can be a sacrificial material or sacrificial layer. The dummy gate oxide 24 can be planarized and etched back for formation over the heteroepitaxial stack 20. The planarization can be achieved by wet etching, for example, a sulfuric acid, hydrogen peroxide mixture (SPM) cleaning process, or the planarization can be achieved by ashing.

Figure 5:
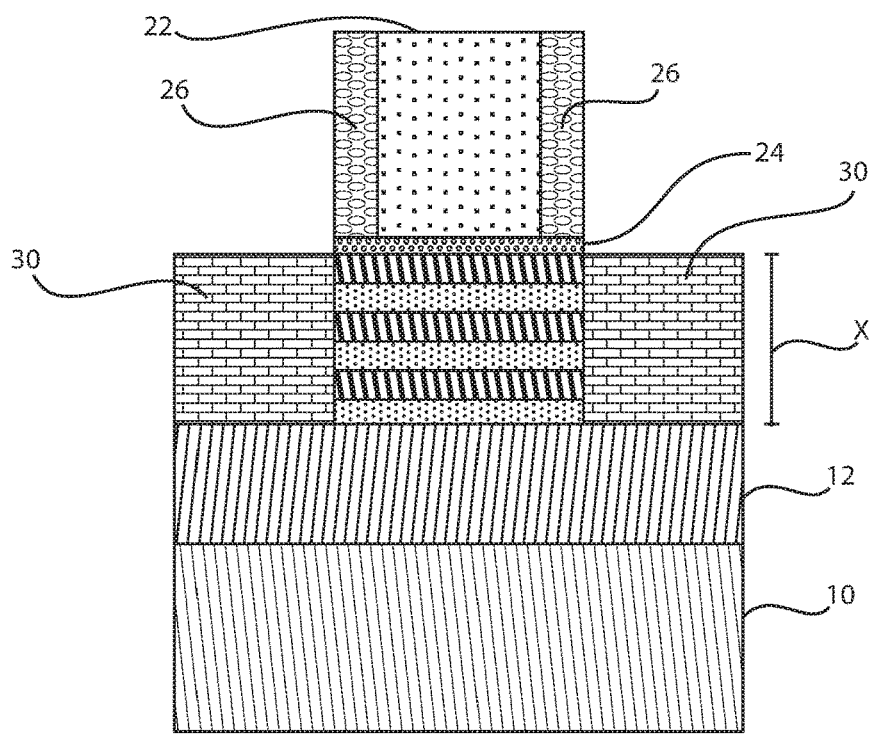
FIG. 5 is a cross-sectional view of the semiconductor device of FIG. 3 (NS length direction) illustrating source/drain epitaxial growth, in accordance with an embodiment of the present invention.

FIG. 5 is a cross-sectional view of the semiconductor device of FIG. 3 (NS length direction) illustrating source/drain epitaxial growth, in accordance with an embodiment of the present invention.

In various embodiments, source/drain 30 is deposited or formed via epitaxial growth. Depending on how the epitaxial growth develops, it may be necessary to anisotropically etch the epitaxial growth. The source/drain 30 extends a distance "X" adjacent the heteroepitaxial stack 20. In one example embodiment, the source/drain 30 extends up to a top surface of the buried insulator layer 12.

The doped regions 30 can be formed over the buried insulator layer 12 of the substrate 10. The dopant can be provided to the doped region(s) 30 (e.g., source/drain region(s)) by ion implantation, and source/drains formed by annealing the doped region(s) 30. In various embodiments, the doped regions 30 can be n-doped or p-doped.

In various embodiments, the doped regions 30 can be doped in-situ or ex-situ, for example, through ion implantation or thermal diffusion of dopants into the substrate. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming the source and drain regions 30 can include forming an in situ doped epitaxial semiconductor material over the buried insulator layer 12. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions 30 can be composed of silicon (Si), germanium (Ge), silicon germanium (SiGe), silicon doped with carbon (Si:C) or a combination thereof. In one example, the p-type source and drain regions can be provided by silicon germanium (SiGe) epitaxial semiconductor material. In one embodiment, a number of different sources can be used for the epitaxial deposition of the epitaxial semiconductor material that provides the source and drain regions 30.

Examples of silicon including source gasses can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gasses for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition can result in crystal defects and film cracking.

The epitaxial semiconductor material that provides the source and drain regions 30 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source can include diborane ($B_2H_6$).

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

Figure 6:
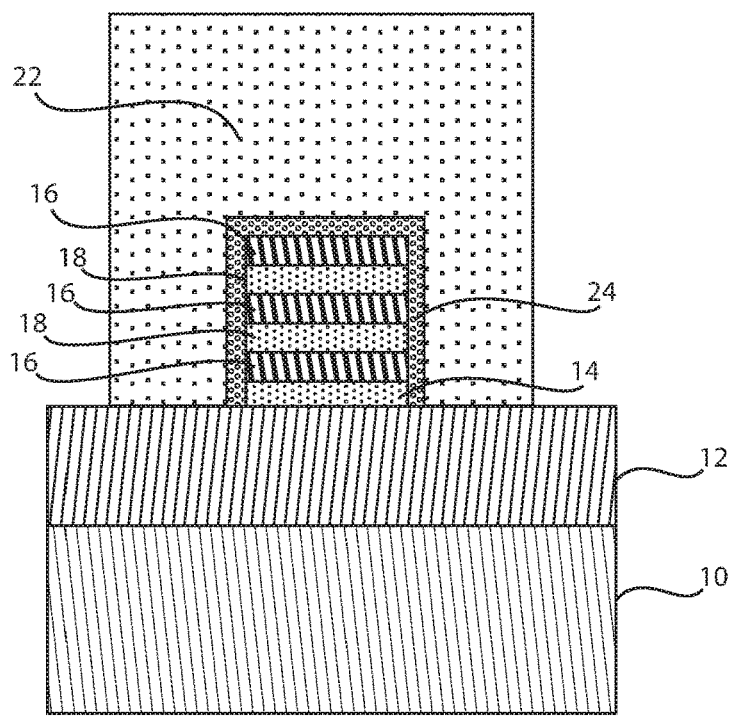
FIG. 6 is a cross-sectional view of the semiconductor device of FIG. 4 (NS width direction) illustrating source/drain epitaxial growth, in accordance with an embodiment of the present invention.

FIG. 6 is a cross-sectional view of the semiconductor device of FIG. 4 (NS width direction) illustrating source/drain epitaxial growth, in accordance with an embodiment of the present invention.

Along the NS width direction, the dummy gate 22 is shown covering the entire heteroepitaxial stack 20. Additionally, the dummy gate oxide 24 covers the entire heteroepitaxial stack 20. The source/drain epitaxial growth is not visible from the width direction.

Figure 7:
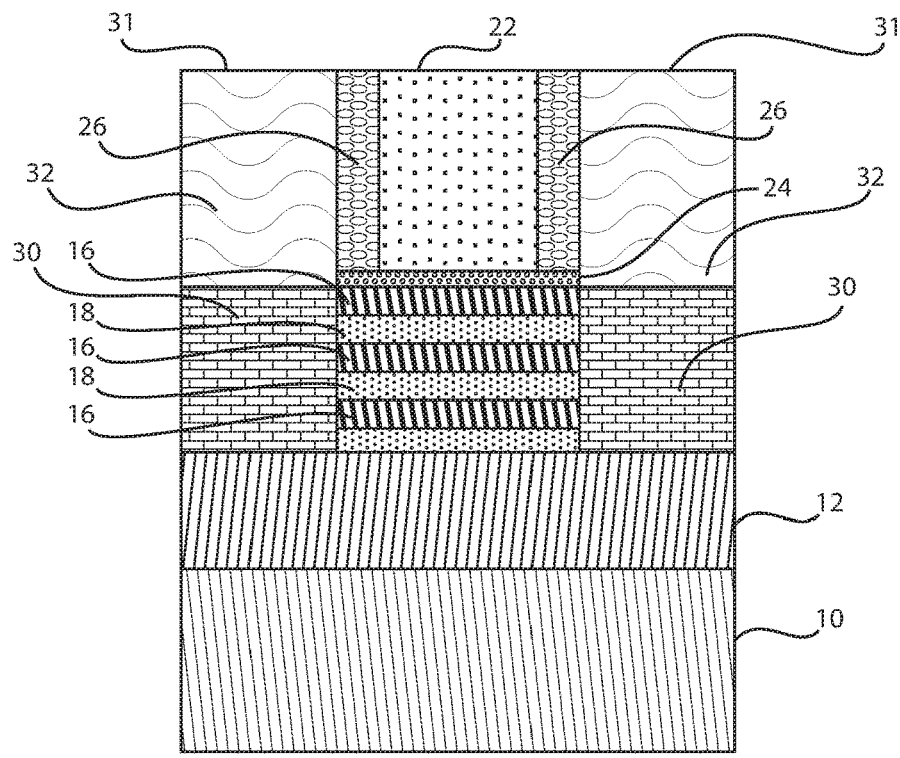
FIG. 7 is a cross-sectional view of the semiconductor device of FIG. 5 (NS length direction) illustrating inter-level dielectric (ILD) deposition and planarization, in accordance with an embodiment of the present invention.

FIG. 7 is a cross-sectional view of the semiconductor device of FIG. 5 (NS length direction) illustrating inter-level dielectric (ILD) deposition and planarization, in accordance with an embodiment of the present invention.

In various embodiments, an inter-layer dielectric (ILD) oxide fill takes place. The ILD 32 is planarized. The ILD 32 engages an outer surface of the sidewall spacers 26. In one example embodiment, the ILD 32 extends to a top point of the spacers 26. Stated differently, a top surface 31 of the ILD 32 is flush with the distal end of the spacers 26.

In one or more embodiments, the ILD 32 can have a thickness in the range of about 20 nm to about 150 nm, or in the range of about 30 nm to about 50 nm.

The ILD 32 can be selected from the group including silicon containing materials such as $SiO_2$, $Si_3N_4$, $SiOxN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 32 include any of the aforementioned materials in porous form, or in a form that changes during processing to or from being porous and/or permeable to being non-porous and/or non-permeable.

In various embodiments, the height of the ILD 32 can be selectively reduced by chemical-mechanical polishing (CMP) and/or etching. Therefore, the planarization process can be provided by CMP. Other planarization process can include grinding and polishing.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 8:
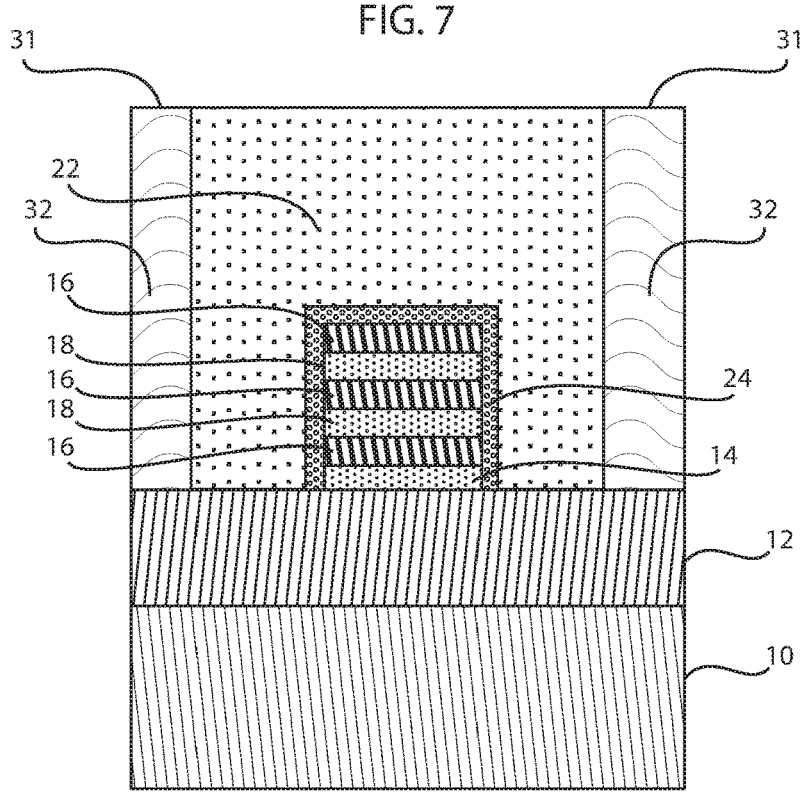
FIG. 8 is a cross-sectional view of the semiconductor device of FIG. 6 (NS width direction) illustrating inter-level dielectric (ILD) deposition and planarization, in accordance with an embodiment of the present invention.

FIG. 8 is a cross-sectional view of the semiconductor device of FIG. 6 (NS width direction) illustrating inter-level dielectric (ILD) deposition and planarization, in accordance with an embodiment of the present invention.

Along the NS width direction, the ILD 32 is shown adjacent the dummy gate 22. The source/drain epitaxial growth is still not visible from the width direction after deposition of the ILD 32.

Figure 9:
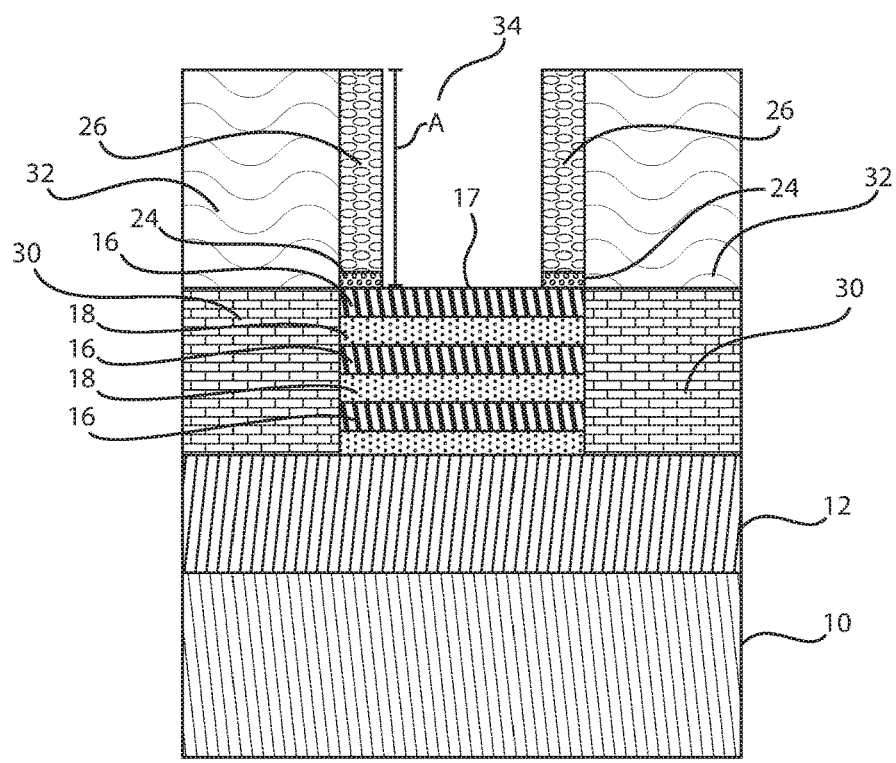
FIG. 9 is a cross-sectional view of the semiconductor device of FIG. 7 (NS length direction) illustrating dummy gate and dummy oxide removal, in accordance with an embodiment of the present invention.

FIG. 9 is a cross-sectional view of the semiconductor device of FIG. 7 (NS length direction) illustrating dummy gate and dummy oxide removal, in accordance with an embodiment of the present invention.

In various embodiments, the dummy gate 22 and the dummy gate oxide 24 can be removed resulting in a recess 34 formed between the spacers 26. The recess 34 can have a depth of "A." The recess 34 extends to a top surface 17 of the first sacrificial material 16 of the heteroepitaxial stack 20.

Figure 10:
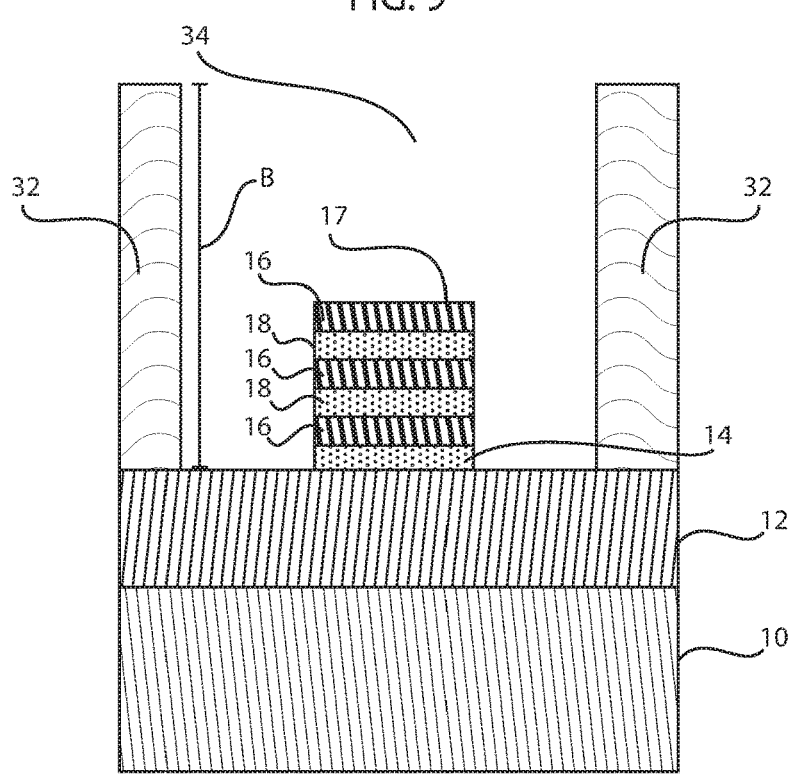
FIG. 10 is a cross-sectional view of the semiconductor device of FIG. 8 (NS width direction) illustrating dummy gate and dummy oxide removal, in accordance with an embodiment of the present invention.

FIG. 10 is a cross-sectional view of the semiconductor device of FIG. 8 (NS width direction) illustrating dummy gate and dummy oxide removal, in accordance with an embodiment of the present invention.

Along the NS width direction, the recess 34 is shown extending a distance "B" to the top surface of the buried insulator layer 12. Additionally, the entire heteroepitaxial stack 20 is visible from this angle.

Figure 11:
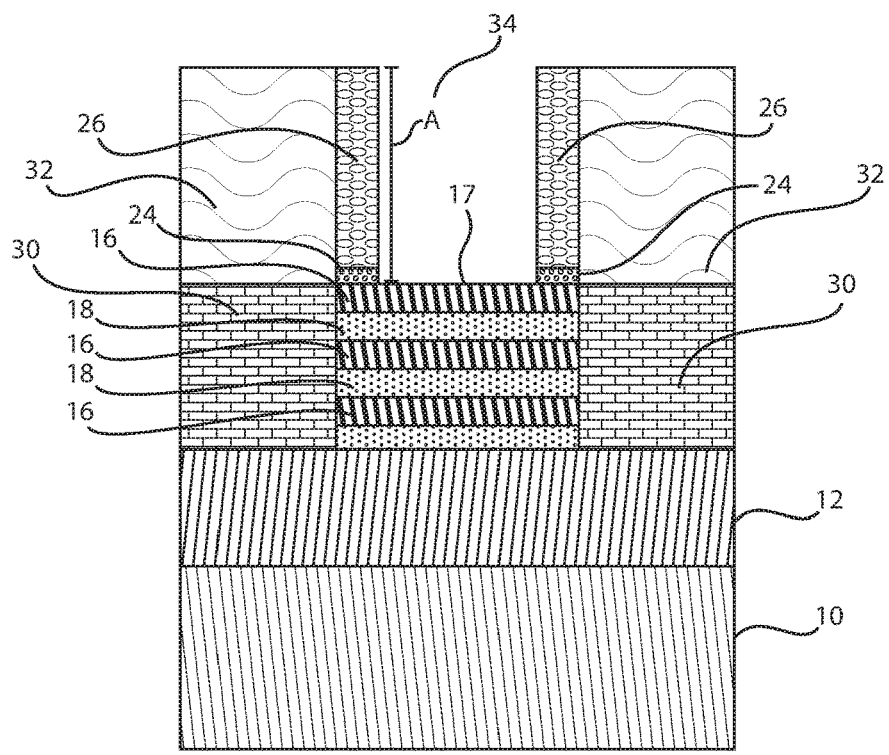
FIG. 11 is a cross-sectional view of the semiconductor device of FIG. 9 (NS length direction) illustrating partial NS release, in accordance with an embodiment of the present invention.

FIG. 11 is a cross-sectional view of the semiconductor device of FIG. 9 (NS length direction) illustrating partial NS release, in accordance with an embodiment of the present invention.

In various embodiments, a partial nanosheet (NS) release takes place. For the length direction angle, the structure appears the same as in FIG. 9.

Figure 12:
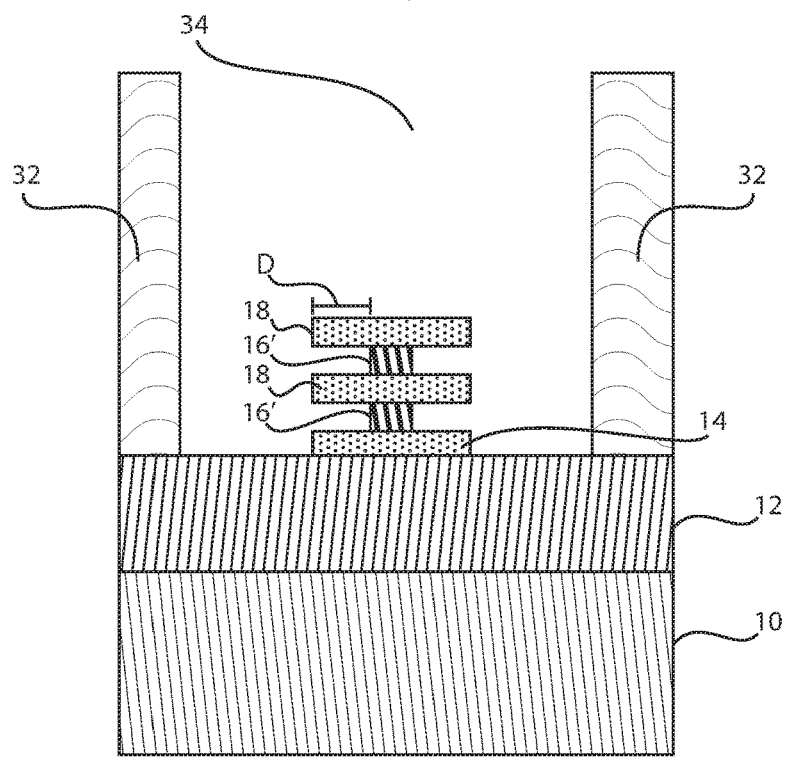
FIG. 12 is a cross-sectional view of the semiconductor device of FIG. 10 (NS width direction) illustrating partial NS release, in accordance with an embodiment of the present invention.

FIG. 12 is a cross-sectional view of the semiconductor device of FIG. 10 (NS width direction) illustrating partial NS release, in accordance with an embodiment of the present invention.

Along the NS width direction, however, the first sacrificial material 16 has been etched to form remaining sacrificial material 16'. The sacrificial material 16 has been recessed by a distance "D," thus resulting in a corrugated channel profile along the heteroepitaxial stack sidewall. Moreover, the partial release is masked, meaning that devices which need full NS release can be blocked at this step. Alternately, all devices can see partial release, and partial devices can be masked from the secondary full release step.

Figure 13:
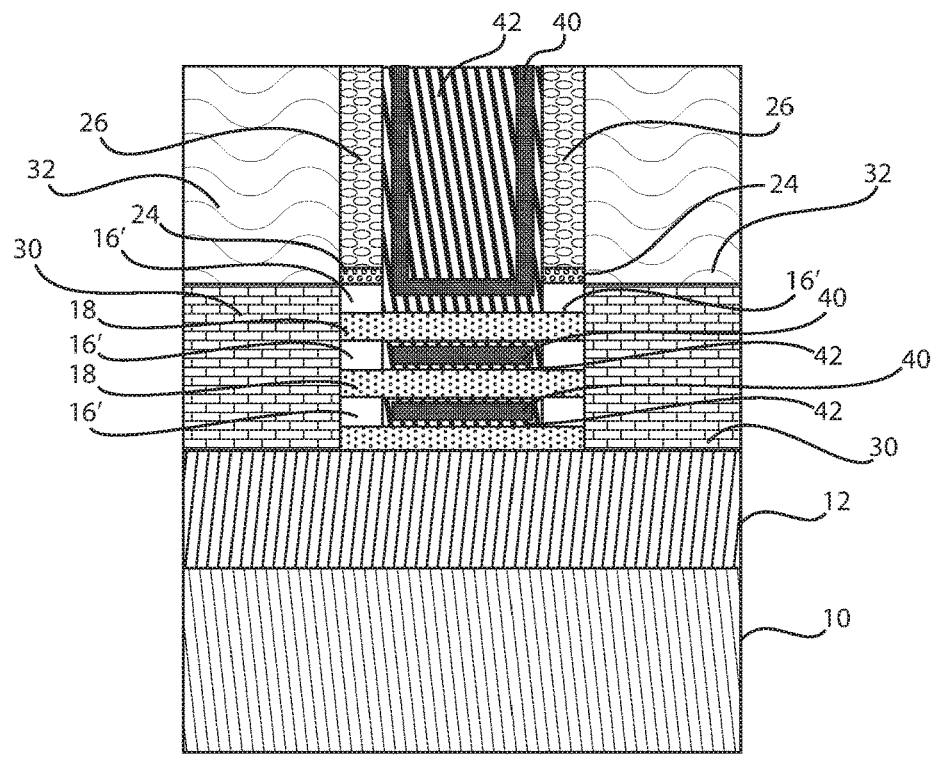
FIG. 13 is a cross-sectional view of the semiconductor device of FIG. 12 (NS length direction) illustrating a metal gate fill and planarization, in accordance with an embodiment of the present invention.

FIG. 13 is a cross-sectional view of the semiconductor device of FIG. 11 (NS length direction) illustrating a metal gate fill and planarization, in accordance with an embodiment of the present invention.

In various embodiments, a metal gate fill takes place, as well as planarization. The HKMG includes a high-k material 40 and a conducting layer or metal layer 42. The HKMG stack 40, 42 engages or contacts the spacers 26, as well as the side surface of the remaining sacrificial material 16'.

In various embodiments, the HKMG stack 40, 42 can include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In various embodiments, the HKMG stack 40, 42 can have a thickness in the range of about 1.5 nm to about 2.5 nm.

Figure 14:
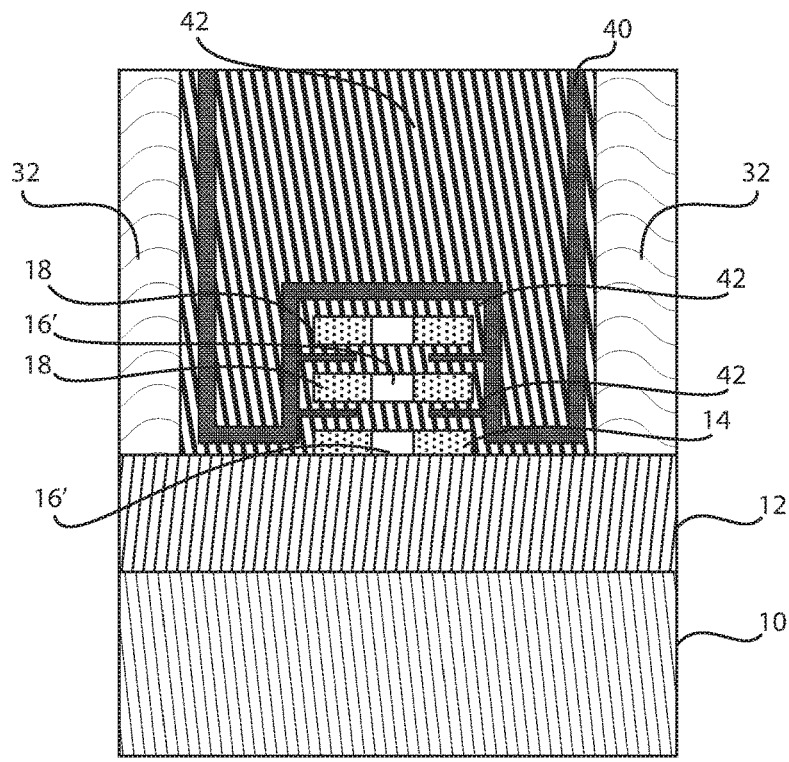
FIG. 14 is a cross-sectional view of the semiconductor device of FIG. 13 (NS width direction) illustrating a metal gate fill and planarization, in accordance with an embodiment of the present invention.

FIG. 14 is a cross-sectional view of the semiconductor device of FIG. 12 (NS width direction) illustrating a metal gate fill and planarization, in accordance with an embodiment of the present invention.

Along the NS width direction, the metal fill extends to the sidewalls of the spacers 26. Additionally, the metal fill also takes place adjacent the etched portion of the sacrificial material 16. Thus, the metal fill extends a distance "D" within the etched areas or regions of the first sacrificial material 16. The metal fill contacts or engages the remaining sacrificial material 16. The HKMG stack 40, 42 encompasses the entire heteroepitaxial stack 20. The height of the HKMG stack 40, 42 is greater than the height of the heteroepitaxial stack 20.

Figure 15:
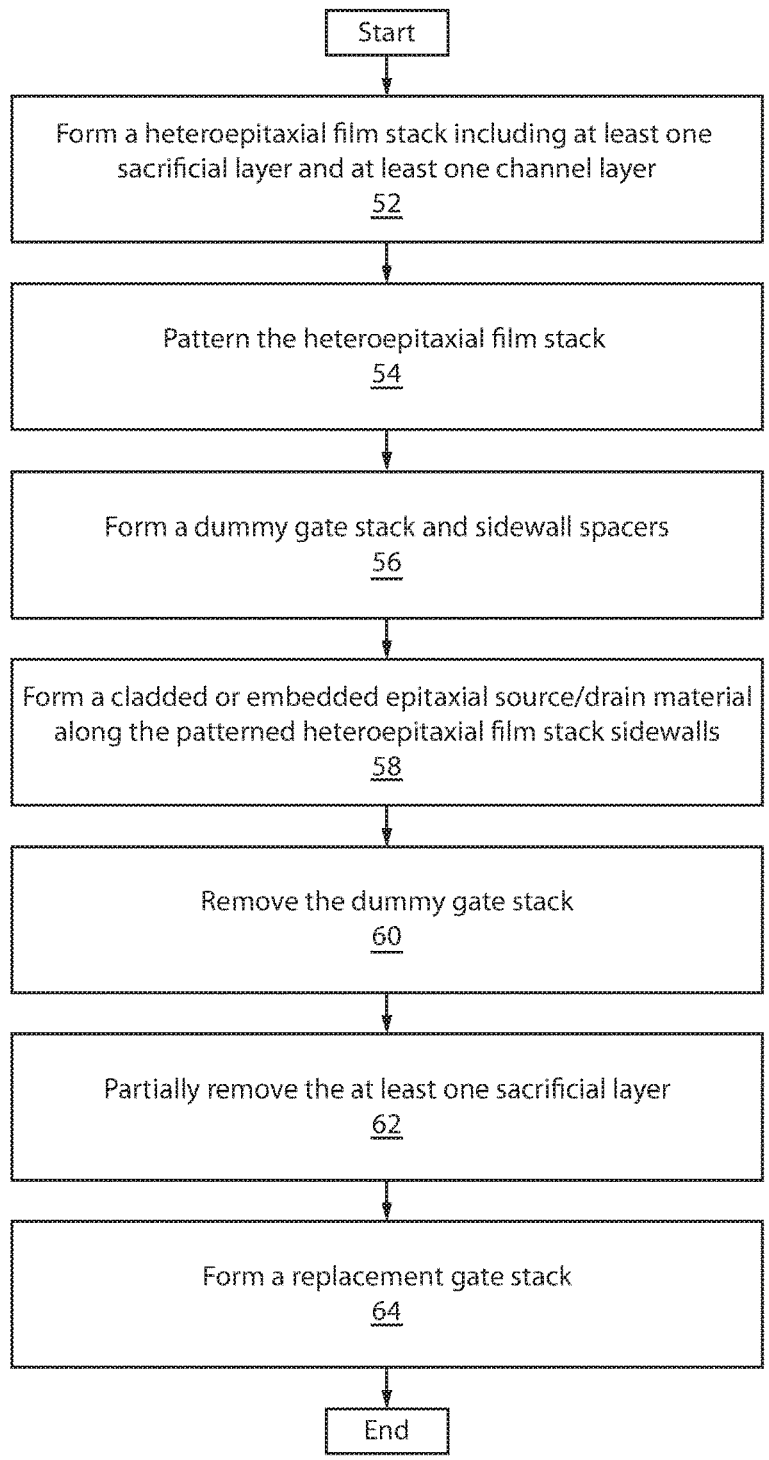
FIG. 15 is a block/flow diagram of an exemplary method for incorporating compressive strain into nanosheet MOSFET channel regions, in accordance with an embodiment of the present invention.

FIG. 15 is a block/flow diagram of an exemplary method for incorporating compressive strain into nanosheet MOSFET channel regions, in accordance with an embodiment of the present invention.

At block 52, a heteroepitaxial film stack is formed including at least one sacrificial layer and at least one channel layer. The sacrificial layer can be, e.g., either Si or SiGe. Similarly, the channel layer can be, e.g., either SiGe or Si.

At block 54, the heteroepitaxial film stack is patterned.

At block 56, a dummy gate stack and sidewall spacers are formed. The dummy gate stack can include a stack of materials, such as a dummy gate dielectric, amorphous Si, or a dielectric cap.

At block 58, an epitaxial source/drain material is formed along the patterned heteroepitaxial film stack sidewalls. The source/drain material can extend up to a top surface of the buried insulator layer.

At block 60, the dummy gate stack is removed. Removal results in a recess formed between the spacers.

At block 62, the at least one sacrificial layer is partially removed.

At block 64, a replacement gate stack is formed.

The nanosheets can include a thin layer of conducting channel material. For example, in some embodiments, one or more of the nanosheets can include Si, SiGe, Ge, and/or a Group III-V semiconductor material, for example InGaAs, but the inventive concept is not limited thereto. The term "Si nanosheet FET" refers to nanosheet FETs with nanosheets including Si or including a large percentage of Si, for example $Si_xGe_{1-x}$, where x is greater than about 0.3. The term "non-Si nanosheet FET" refers to nanosheet FETs with nanosheets not including Si, for example InGaAs, or including a small percentage of Si, for example $Si_yGe_{1-y}$, where y is less than about 0.3.

A non-Si nanosheet FET can have a higher channel carrier mobility than an equivalent Si nanosheet FET. The higher channel carrier mobility can result in higher performance. However, the non-Si nanosheet FET can also have higher band-to-band tunneling (BTBT) leakage current than the equivalent Si nanosheet FET. In general, high BTBT leakage current can occur in the same device design range as high channel carrier mobility. Several factors can induce higher BTBT leakage current in a non-Si nanosheet FET. For example, a parasitic-bipolar-effect (PBE) can effectively multiply a BTBT leakage current by a large value for non-Si nanosheet FETs with nanosheets including $Si_yGe_{1-y}$, where y is less than about 0.3, to result in a net BTBT-induced leakage current that is significantly high.

The methods described herein can include different masking and etching processes. Masking and etching can include patterning and etching the stacked layers into desired dimensions to define the width of each nano sheet and horizontal spacing between each nanosheet, in each horizontal plane. In some embodiments, the length of each nanosheet can also be defined within this action but, in some embodiments, can be defined at another action. A single mask and etch, or multiple masks and etches, can be used to define the width and spacing between each nanosheet, in each horizontal plane. In some embodiments, an etch, for example a dry etch, that is not selective to either of the conduction channel material or sacrificial material can be utilized. In some embodiments, a multiple-etch process using different etch gas chemistries to selectively etch each of the conduction channel material and sacrificial material can be utilized. The methods can include forming dummy gates (not shown), forming spacers (not shown), depositing dielectric material (not shown), removing dummy gates (not shown), and removing sacrificial material. In some embodiments, removing sacrificial material can include a wet etch process and/or combination wet/dry etch.

In summary, the exemplary embodiments of the present invention incorporate strain into nanosheet PFET channel regions, that is, compressive strain. The compressive strain is achieved by providing:

(1) a cladded source/drain epitaxy in the device structure (namely, the lack of an embedded epi cavity that is formed prior to epi growth).

(2) use of SiGe as the channel layer and Si as the sacrificial release layer.

(3) complete nanosheet release during RMG.

Therefore, as a result of the structure of the exemplary embodiments, compressive strain in nanosheet SiGe channel regions increases PFET mobility and therefore drive current. Remaining sacrificial material from partial release process, if optimized, can increase the channel width per footprint, thus increasing the total drive current per footprint.

In summary, the exemplary embodiments of the present invention incorporate strain into nanosheet NFET channel regions, that is, tensile strain. The tensile strain is achieved by providing:

(1) an embedded source/drain epitaxy in the device structure (namely, the lack of an embedded epi cavity that is formed prior to epi growth).

(3) use of Si as the channel layer and SiGe as the sacrificial release layer.

(4) incomplete (e.g., partial) nanosheet release during RMG.

Therefore, as a result of the structure of the exemplary embodiments, tensile strain in nanosheet Si channel regions increases NFET mobility and therefore drive current. Remaining sacrificial material from partial release process, if optimized, can increase the channel width per footprint, thus increasing the total drive current per footprint.

Moreover, the nanosheet MOSFET structure includes one or more of a plurality of heteroepitaxially stacked channel and sacrificial regions, sacrificial regions that have a width that is smaller than that of the channel regions, sacrificial regions that have a lattice constant that differs from that of the channel regions, and cladded source/drain epitaxial regions.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element could be termed a second element without departing from the scope of the present concept.

Having described preferred embodiments of a method of device fabrication and a semiconductor device thereby fabricated (which are intended to be illustrative and not limiting) to provide for nanosheet metal oxide semiconductor field effect transistors (MOSFETs) with partial release and cladded or embedded source/drain epitaxy, it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a nanosheet metal oxide semiconductor field effect transistor (MOSFET) structure, the method comprising:
    forming a heteroepitaxial film stack including at least one sacrificial layer and at least one channel layer;
    patterning the heteroepitaxial film stack;
    forming a dummy gate stack and sidewall spacers;
    forming a cladded or embedded epitaxial source/drain region directly contacting sidewalls of each of the at least one sacrificial layer and each of the at least one channel layer such that elastic relaxation of the at least one sacrificial layer causes tensile strain to the at least one channel layer;
    removing the dummy gate stack;
    partially removing sections of the at least one sacrificial layer such that remaining sections of the at least one sacrificial layer preserve the tensile strain in the at least one channel layer; and
    forming a replacement gate stack directly in contact with the remaining sections of the at least one sacrificial layer.

2. The method of claim 1, wherein the at least one sacrificial layer is silicon germanium (SiGe) and the at least one channel layer is silicon (Si).

3. The method of claim 1, wherein the at least one sacrificial layer is silicon (Si) and the at least one channel layer is silicon germanium (SiGe).

4. The method of claim 1, wherein the at least one sacrificial layer has a width that is less than a width of the at least one channel layer.

5. The method of claim 1, wherein the at least one sacrificial layer has a lattice constant that is different than a lattice constant of the at least one channel layer.

6. The method of claim 1, wherein the heteroepitaxial film stack is recessed in the source/drain region to allow for elastic relaxation of a SiGe/Si heterostructure.

7. The method of claim 6, wherein the relaxation of the at least one sacrificial layer results from the recess of the SiGe/Si heterostructure in the source/drain region.

8. The method of claim 1, wherein the formation of the replacement gate stack results in a corrugated channel profile along the patterned heteroepitaxial film stack sidewalls.

9. The method of claim 1, wherein, after partial removal, remaining portions of the at least one sacrificial layer preserve tensile strain in the at least one channel layer.

10. A method of forming a nanosheet metal oxide semiconductor field effect transistor (MOSFET) structure, the method comprising:
    forming a heteroepitaxial film stack including alternating sacrificial and channel layers;
    forming a dummy gate stack;
    forming a cladded or embedded epitaxial source/drain region directly contacting sidewalls of each of the alternating sacrificial and channel layers such that elastic relaxation of the sacrificial layers cause tensile strain to the channel layers;
    removing the dummy gate stack;
    partially removing sections of the sacrificial layers such that remaining sections of the sacrificial layers preserve the tensile strain in the channel layers; and
    forming a replacement gate stack resulting in a corrugated channel profile along sidewalls of the heteroepitaxial film stack, the replacement gate stack directly contacting the remaining sections of the sacrificial layers.

11. The method of claim 10, wherein the sacrificial layers are silicon germanium (SiGe) layers and the channel layers are silicon (Si) layers.

12. The method of claim 10, wherein the at least one sacrificial layer is silicon (Si) and the at least one channel layer is silicon germanium (SiGe).

13. The method of claim 10, wherein the sacrificial layers have a width that is less than a width of the channel layers.

14. The method of claim 10, wherein the sacrificial layers have a lattice constant that is different than a lattice constant of the channel layers.

15. The method of claim 10, wherein the channel layers exhibit tensile strain due to relaxation of the sacrificial layers.

16. The method of claim 10, wherein, after partial removal, remaining portions of the sacrificial layers preserve tensile strain in the channel layers.

17. The method of claim 10, wherein the heteroepitaxial film stack is recessed in the source/drain region to allow for elastic relaxation of a SiGe/Si heterostructure.

18. The method of claim 17, wherein the relaxation of the at least one sacrificial layer results from the recess of the SiGe/Si heterostructure in the source/drain region.

* * * * *